United States Patent
Skerlj et al.

(10) Patent No.: US 7,592,830 B2
(45) Date of Patent: Sep. 22, 2009

(54) INTEGRATED CIRCUIT DEVICE FOR RECEIVING DIFFERENTIAL AND SINGLE-ENDED SIGNALS

(75) Inventors: Maurizio Skerlj, Munich (DE); Claudio Andreotti, Munich (DE)

(73) Assignee: Qimonda AG, Munich (DE)

( * ) Notice: Subject to any disclaimer, the term of this patent is extended or adjusted under 35 U.S.C. 154(b) by 0 days.

(21) Appl. No.: 11/833,376

(22) Filed: Aug. 3, 2007

(65) Prior Publication Data

US 2009/0033364 A1  Feb. 5, 2009

(51) Int. Cl.
*H03K 17/16* (2006.01)
(52) U.S. Cl. .......................................... 326/26; 326/82

(58) Field of Classification Search ................ 326/21, 326/26, 27, 82–86
See application file for complete search history.

(56) References Cited

U.S. PATENT DOCUMENTS

| 6,433,579 | B1 | * | 8/2002 | Wang et al. ................ 326/38 |
| 6,493,394 | B2 | * | 12/2002 | Tamura et al. ............. 375/257 |
| 6,566,926 | B1 | * | 5/2003 | Patterson .................... 327/206 |
| 7,079,446 | B2 |   | 7/2006 | Murtagh et al. |
| 7,298,837 | B2 | * | 11/2007 | Patterson ............... 379/399.01 |

* cited by examiner

*Primary Examiner*—Don P Le
(74) *Attorney, Agent, or Firm*—Dicke, Billig, Czaja PLLC

(57) ABSTRACT

An integrated circuit device includes a receiver that is capable of receiving and converting either differential input signals or two unrelated single-ended input signals.

19 Claims, 4 Drawing Sheets

INTEGRATED CIRCUIT DEVICE FOR RECEIVING DIFFERENTIAL AND SINGLE-ENDED SIGNALS

BACKGROUND

Integrated circuit devices, such as those used in computer systems, must communicate with one another. Differential signaling is often used in data transfer applications since it offers good signal integrity and common mode noise is rejected. Moreover, higher data-rates can be achieved with low swing signaling, as the equivalent swing at the differential receiver will be doubled. Those advantages come at the price of requiring transmitting both the true and the complimentary signals. Additionally, a more complex differential signal routing is required (two signals must be routed as close as possible and care must be taken in length matching).

It is common practice in wide parallel interfaces, such as memory interfaces, to make use of differential signaling for timing critical signals such as clocks or strobes, and to use single-ended signaling for data in order to keep the design compact and save board real estate. With this mixed approach the number of connections can generally be kept to a minimum.

Due to the different type of signaling employed in transmitting data and timing reference signals, special care must be taken in order to not disrupt the timing relationship between the signals. In order to match the latencies between the differential and single-ended receiver, the same type of receiver is typically used for receiving both the single-ended and differential signals. However, even if the same type of receiver is employed in receiving the two signals, a mismatch can occur. This, in turn, can result in requiring more frequent or even continuous calibration or clock resynchronization. Moreover, with such receivers, high gain receivers are often used, which increases power consumption.

For these and other reasons, there is a need for the present invention.

SUMMARY

In accordance with aspects of the invention, an integrated circuit device includes a receiver that is capable of receiving and converting either differential input signals or two unrelated single-ended input signals.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1A:
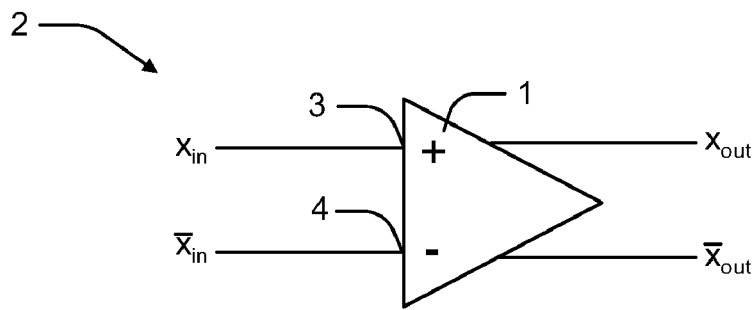
FIG. 1A illustrates a typical receiver for receiving differential signals.
Figure 1B:
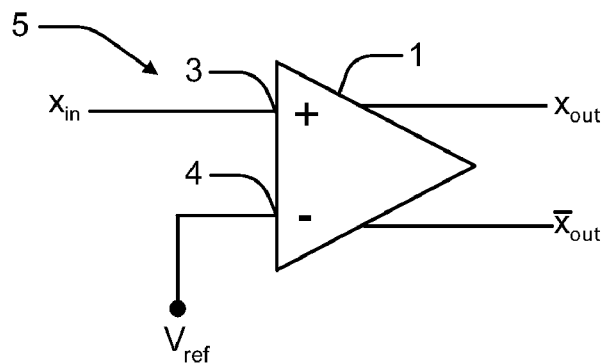
FIG. 1B illustrates the receiver shown in FIG. 1A configured for receiving single-ended signals.

FIGS. 1A and 1B illustrate a typical receiver set-up, in which both differential signaling and single-ended signaling are used. Due to the different types of signaling employed in transmitting data and timing reference signals, special care must be taken in order to not disrupt the timing relationship between the signals. In order to match the latencies between the differential and single-ended receiver, the same type of receiver is typically used for receiving both the single-ended and differential signals. In FIG. 1A, the receiver 1 has inputs 3, 4 that receive differential signals—one input receives the complement to the other input. An $x_{in}$ signal is received at the positive input 3 and the complementary signal $\bar{x}_{in}$ is received at the negative input 4. FIG. 1B illustrates the receiver 1 arranged for single-ended signals, with the positive input 3 receiving the $x_{in}$ signal and the negative input 4 connected to $V_{ref}$ to compare the $x_{in}$ signal to $V_{ref}$. If, for example, one data bite includes one clock signal and eight single-ended data signals, nine receivers would be required (one receiver as shown in FIG. 1A for receiving the differential clock signal, and eight receivers as shown in FIG. 1B for receiving the single-ended data signals).

Figure 2:
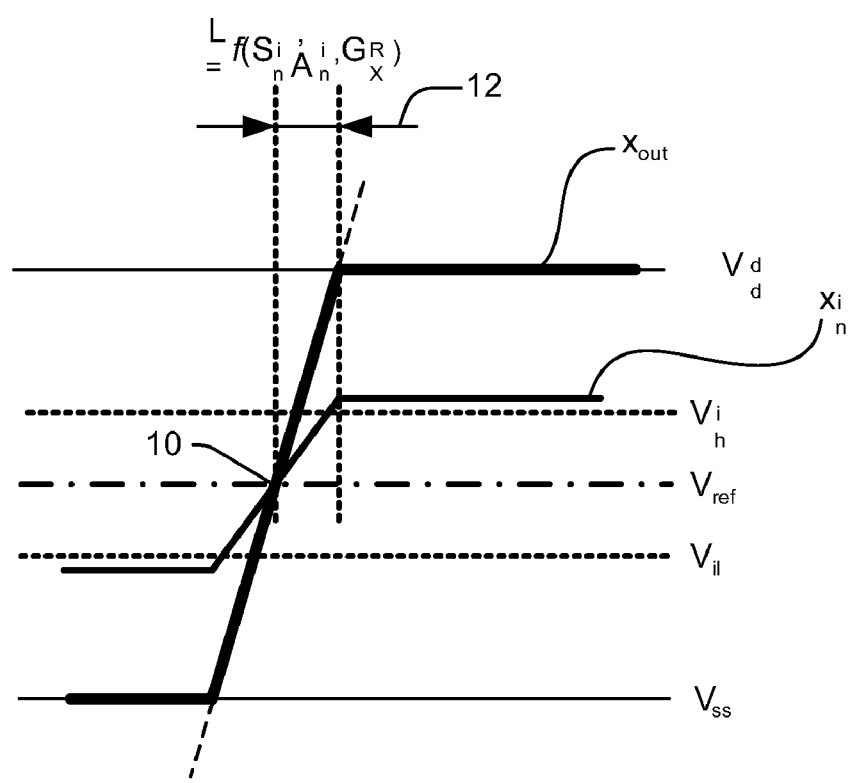
FIG. 2 illustrates typical receiver latency for input and output signals.

Even if the very same receiver is employed in receiving the two signals, a mismatch can occur. As shown in FIG. 2, the receiver latency L depends on the input slope $S_{in}$, amplitude $A_{in}$, and on the receiver gain $G_{RX}$. For the sake of simplicity, the intrinsic latency of the receiver (the constant part of the receiver latency that does not depend on the input's signal shape) is neglected. The crossing of the reference voltage $V_{ref}$ (indicated by reference 10) is taken as the input decision level, while the highest and the lowest power supplies present in the system (respectively $V_{dd}$ and $V_{ss}$ in FIG. 2) are taken as output decision levels. The latency is therefore defined as the difference in time between the input and output signals crossing the decision thresholds, and is indicated at reference 12 in FIG. 2. What follows still holds true if different decision thresholds are taken into account, or a constant is added to the receiver's latency.

Figure 3:
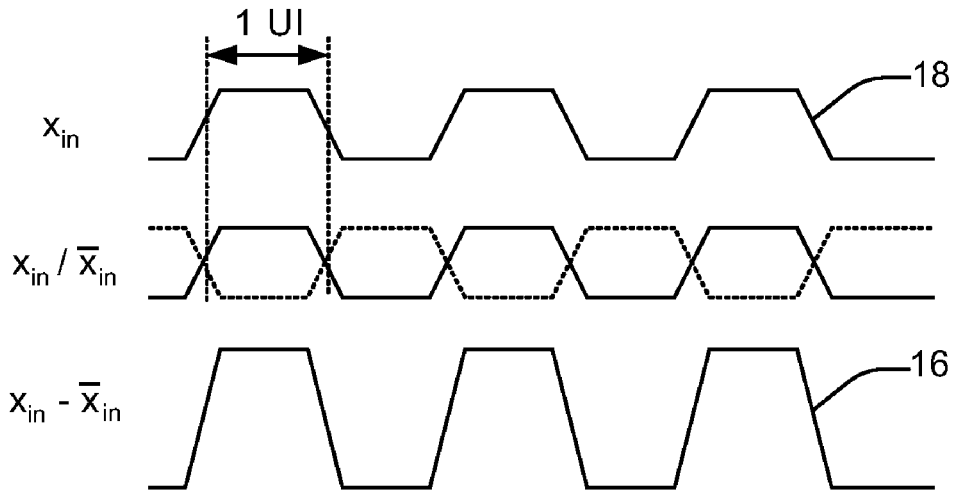
FIG. 3 is a timing diagram illustrating typical differential and single-ended signals.

As illustrated in FIG. 3, the differential signals 16 (once they are resolved) have twice the slew-rate and twice the amplitude of the single-ended signal 18. Such a mismatch can be calibrated out, which is a common practice for the mismatch due to process and on-chip variations. Nevertheless, a non-negligible mismatch in drift between the two receivers due to power supply and temperature variation will demand frequent or continuous calibration or clock resynchronization. Moreover, in order to minimize the latency dependency from the slope and amplitude of the input signals, high gain receivers are used, which come at expense of the power consumption.

With receivers such as illustrated in FIG. 1, single-ended signals are processed using one set of internal levels when single-ended signals are received, and different internal levels when differential signals are received. In accordance with aspects of the present invention, a receiver is disclosed that processes both single-ended and differential signals in the same way, resulting in perfect matching to achieve a constant latency.

Logic levels are defined as follows: $0=V_{ref}$; $2=V_{dd}$; $-2=V_{SS}$; $1=V_{ih}$; and $-1=V_{il}$; where $V_{dd}$ and $V_{ss}$ are the saturated voltage values; respectively, the highest and the lowest power supplies of the system
The reference voltage, $V_{ref}$ is $(V_{dd}-V_{ss})/2$
The high input voltage $V_{ih} \in \{V_{ref}, V_{dd}\}$
The low input voltage $V_{il} \in \{V_{ss}, V_{ref}\}$.

For the sake of simplicity noise margins are not considered.

Let $x_{in}$ and $y_{in}$ be two input signals, $x_{in}, y_{in} \in \{-1,1\}$, and let S and D (sum and difference) be $S=x_{in}+y_{in}$, $D=x_{in}-y_{in}$. Therefore, $S, D \in \{-2,0,2\}$. A further processing leads to $x_{out}=S+D=2x_{in}$, and $y_{out}=S-D=2y_{in}$.

Figure 4:
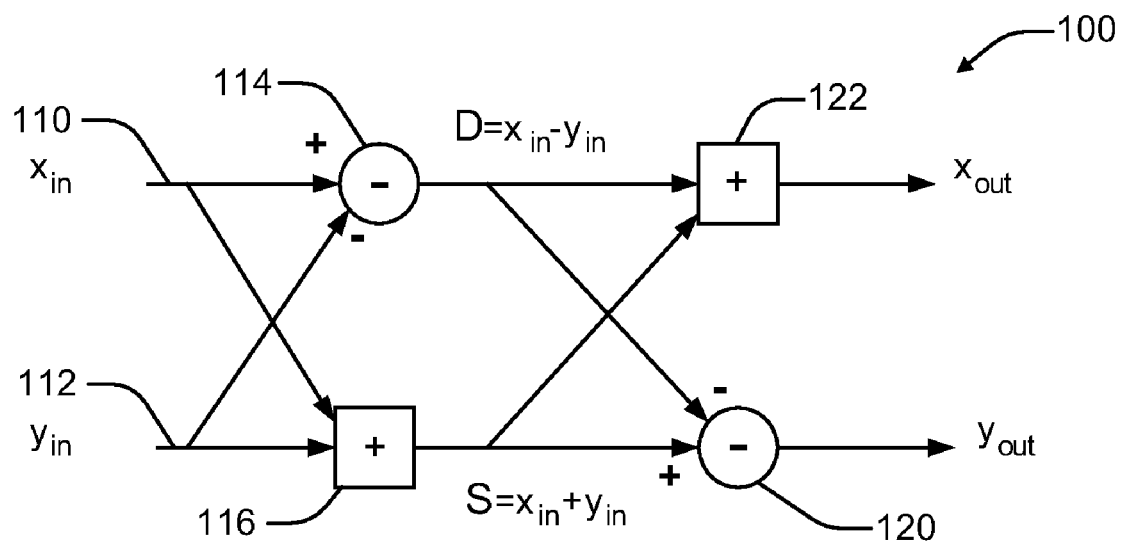
FIG. 4 illustrates an exemplary receiver in accordance with aspects of the present invention.

FIG. 4 illustrates a receiver 100 having a "trellis" structure in accordance with exemplary embodiments of the present invention. The receiver 100 is typically implemented as a part of an integrated circuit chip. The receiver 100 essentially converts input signals to the saturated values. As the difference between the inputs and outputs consists of a constant gain factor, dimensioning circuits to meet the correct logic levels would be a routine undertaking for one skilled in the art having the benefit of this disclosure.

The receiver 100 includes a first input terminal 110 that receives the $x_{in}$ signal and a second input terminal 112 that receives the $y_{in}$ signal. With the receiver 100, the input signals $x_{in}, y_{in}$ can either be differential signals, where $x_{in}$ and $y_{in}$ are complements of one another, or uncorrelated single-ended signals. The receiver 100 has a first stage with a first difference circuit 114 coupled to the first and second input terminals to determine the difference D between the $x_{in}$ and $y_{in}$ input signals, and a first sum circuit 116 coupled to the first and second input terminals to determine the sum S of the $x_{in}$ and $y_{in}$ input signals.

A second stage of the receiver 100 includes a second difference circuit 120 and a second sum circuit 122 coupled to the outputs of the first difference circuit 114 and the first sum circuit 116 to determine the difference and sum of the signals D and S output by the first difference circuit and the first sum circuit, respectively. In this manner, the receiver 100 converts either single-ended or differential input signals to output signals at the saturated voltage levels $V_{dd}$ and $V_{ss}$.

Figure 5A:
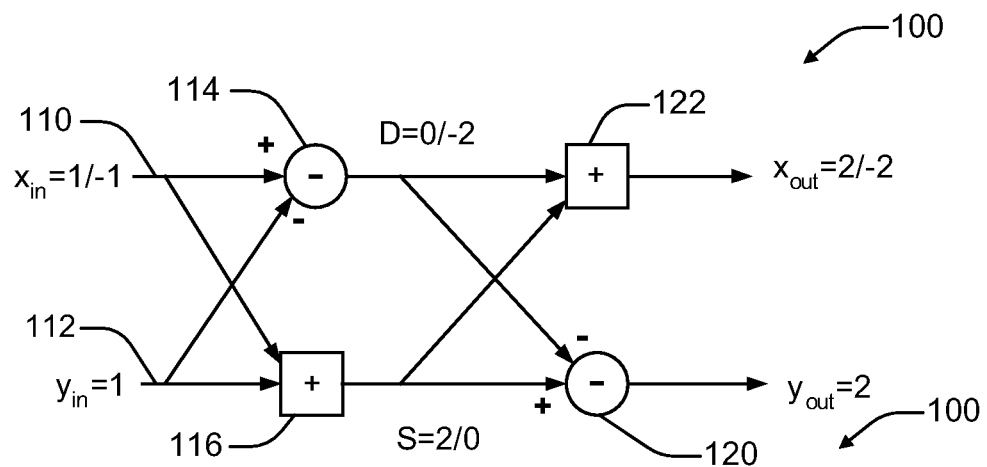
FIGS. 5A and 5B illustrate the receiving process for differential and single-ended input signals.
Figure 5B:
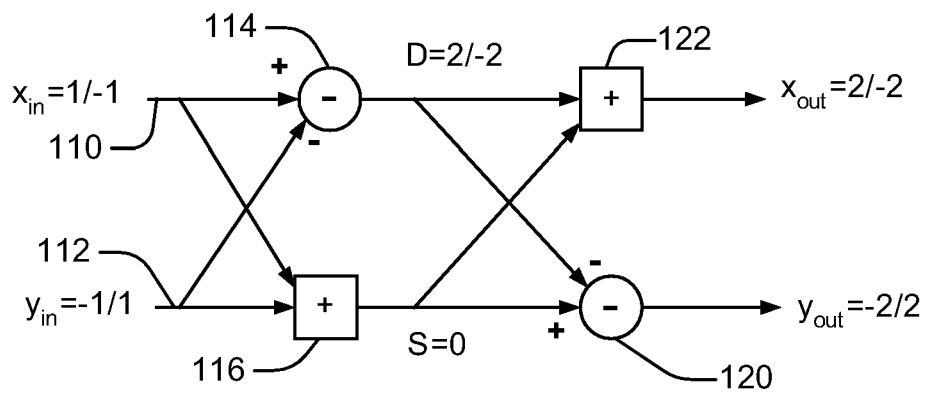

FIG. 5 illustrates the receiving process for different logic values input to the receiver 100. In FIG. 5A, the logic values when receiving two different single-ended signals are shown. When receiving single-ended signals, there are four possible pairs of $x_{in}, y_{in}$ input values, since the inputs are independent of each other. Given the symmetrical structure of the receiver 100 it is sufficient to analyze the behavior of the receiver 100 when input signals are the same polarity (1,1) and when the input signals are opposite polarity (1,-1). FIG. 5B illustrates the logical levels when receiving a differential signal pair ($x_{in}$ is complement of $y_{in}$).

Referring to FIG. 5A, if the input signals $x_{in}$, $y_{in}$ are the same polarity, for example, both positive (1,1), the first difference circuit 114 determines the difference between the inputs (1−1) and the output D=0. The output D of the first difference circuit 114 is received by the second sum and difference circuits 120,122. The first sum circuit 116 also receives the input signals and adds the values (1+1), resulting in the output S=2. The output S of the first sum circuit 116 is also received by the second sum and difference circuits 122, 120. The second sum circuit 122 adds the outputs D,S of the first difference and sum circuits 114,116 (0+2), resulting in the value 2, the $V_{dd}$ voltage, at the $x_{out}$ terminal. The second difference circuit 120 determines the difference of the values output by the first difference and sum circuits 114,116 (2−0), resulting in the value 2, the $V_{dd}$ voltage, at the $y_{out}$ terminal.

In the situation where single-ended signals of opposite polarities −1,1 are received at the inputs $x_{in}$, $y_{in}$, the first difference circuit 114 output D=−2 (−1−1). The first sum circuit 116 adds the values (−1+1), resulting in the output S=0. The second sum circuit 122 adds the outputs D,S of the first difference and sum circuits 114,116 (0+−2), resulting in the value −2, the $V_{ss}$ voltage, at the $x_{out}$ terminal. The second difference circuit 120 determines the difference of the values output by the first difference and sum circuits 114,116 (0−−2), resulting in the value 2, the $V_{dd}$ voltage, at the $y_{out}$ terminal.

FIG. 5B illustrates the operation of the receiver 100 when receiving differential signals. In FIG. 5B, the signal received at the $y_{in}$ terminal is always the complement to the signal received at the $x_{in}$ terminal. Thus, if $x_{in}$ is 1, $y_{in}$ will be −1. For these inputs, the first difference circuit 114 outputs 2 (1−−1). The first sum circuit 116 adds the values (1+−1), outputting a 0. The second sum circuit 122 adds the outputs of the first difference and sum circuits 114,116 (2+0), resulting in the value 2, the $V_{dd}$ voltage, at the $x_{out}$ terminal. The second difference circuit 120 determines the difference of the values output by the first difference and sum circuits 114,116 (0−2), resulting in the value −2, the $V_{ss}$ voltage, at the $y_{out}$ terminal.

If the input values are reversed, with the $x_{in}$, $y_{in}$ terminals receiving −1,1, the first difference circuit 114 outputs −2 (−1−1). The first sum circuit 116 adds the values (−1+1), outputting a 0. The second sum circuit 122 adds the outputs of the first difference and sum circuits 114,116 (−2+0), resulting in the value −2, the $V_{ss}$ voltage, at the $x_{out}$ terminal. The second difference circuit 120 determines the difference of the values output by the first difference and sum circuits 114,116 (0−−2), resulting in the value 2, the $V_{dd}$ voltage, at the $y_{out}$ terminal.

The single ended use of the receiver 100 as illustrated in FIG. 5A, for example, poses an additional requirement on the implementation of the sum and difference functions: each function should first decode separately the two inputs $x_{in}$, $y_{in}$ and decide whether a 1 or a −1 was received and then perform the sum and the difference. This operation does not require any high gain and therefore can be implemented with low power consumption. It should be also noted that the implementation of those functions can differ between the first and the second stage of the receiver 100, as for latency matching purposes they need to match stage by stage. Specifically, the inputs D,S of the second stage are already valid logic levels and therefore, processing can be applied to the signals without any upfront logic level decoding as required for the first stage.

Figure 6:
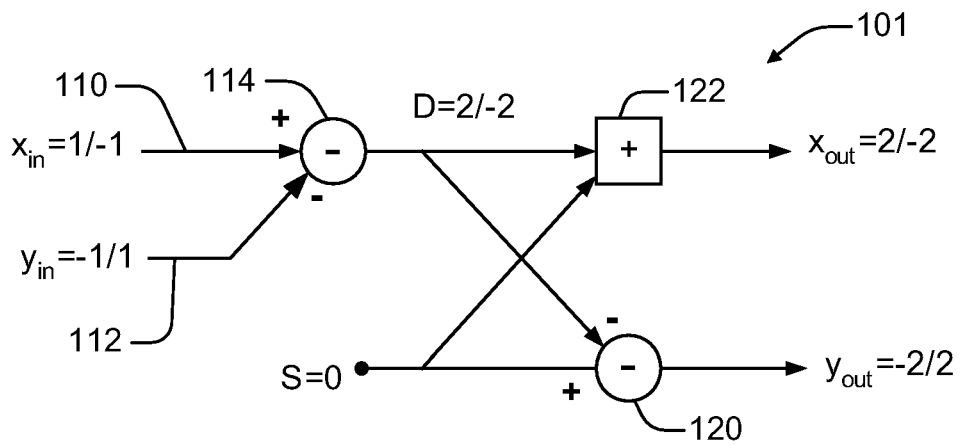
FIG. 6 illustrates an alternative embodiment of a receiver in accordance with further aspects of the present invention.

As shown in FIG. 5B, when the receiver 100 is used for receiving true differential signals, the output S of the first sum circuit 116 is a constant value (0) and thus independent from the inputs $x_{in}$, $y_{in}$. Therefore, in order to have a better common mode noise rejection and save power, the S node can be connected to a constant voltage reference (logic level '0' or reference voltage Vref=(Vdd−Vss)/2, for example) as depicted in the exemplary receiver 101 illustrated FIG. 6. The latency of the receiver 101 will still be the sum of the two stages and therefore will still match the latency of the full trellis receiver 100.

Figure 7:
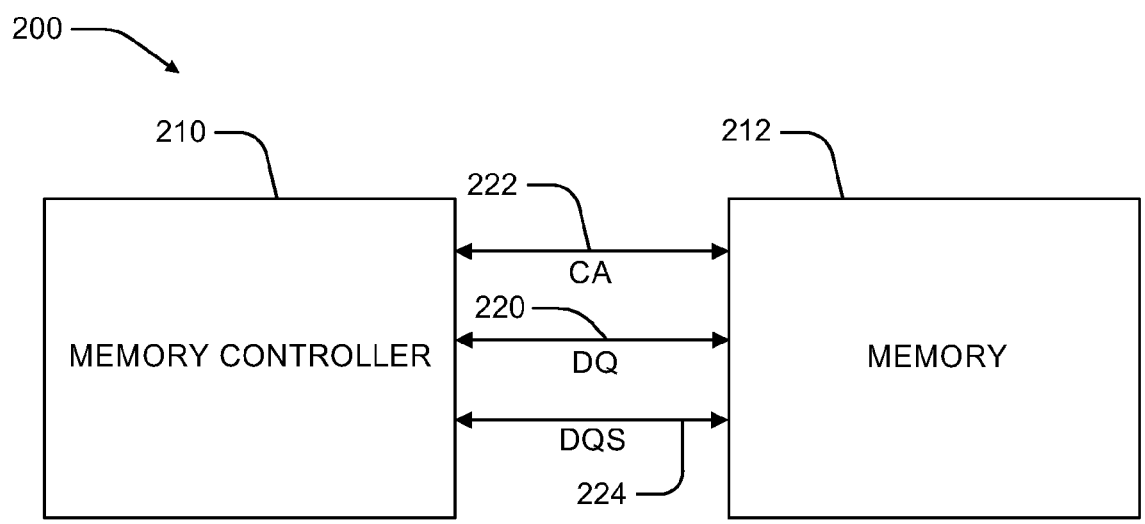
FIG. 7 is a block diagram conceptually illustrating portions of a memory system in accordance with embodiments of the present invention.

The exemplary receivers disclosed herein are particularly useful in integrated circuit implementations having wide parallel interfaces, such main memory interfaces. In such interfaces, usually the memory controller is connected to many memory devices. FIG. 7 conceptually illustrates a simplified memory system 200 including a memory controller 210 coupled to a memory device 212. For simplicity, only a single memory device 212 is shown, and only portions of the memory controller 210 and memory device 212 are shown in FIG. 7. The memory device could be any suitable type of memory, such as a type of dynamic random access memory (DRAM), including SDRAM, SLDRAM, EDO DRAM, etc.

In exemplary embodiments, the memory device 212 is an SDRAM, which includes a plurality of memory banks. Each memory bank includes one or more arrays of memory cells that are arranged in rows and columns, with the rows extending along a row direction and the columns extending along a column direction. Conductive word lines and bit lines extend across the array of memory cells, with a memory cell located at each cross-point of a word line and a bit line or located at each second cross-point. Memory cells are accessed using a row address and a column address.

Several interconnections extend between the memory controller 210 and the memory device 212, including a data bus (DQ bus) 220, a command, address and control bus (CA bus) 222 and DQ strobes (DQS) 224. These connections can consist of simple wires or can also include buffers for address or data regeneration. Such memory interfaces typically consist of a large number of connections. For instance, in 64-bit computer architectures, an additional eight redundancy bits for error detection and correction are added, often referred to as Error Correction Code (ECC) bits.

In a simple implementation of the exemplary memory system 200, the memory controller 210 is directly connected to the memory device 212. Usually in this case the DQ bus 220 is a point-to-point connection, while the CA bus 222 is a fly-by connection. In a 64+ECC architecture, the memory controller 210 must therefore receive 72 DQ bits. Timing information for data sampling is also sent with the DQ bits. If the timing is organized on a byte basis (8 bit organization) there will be nine DQS signals, which in the DDR2 protocol are differential signals. The CA bus includes up to 25 signals plus a differential clock signal.

Assuming the eight memory devices 212 plus ECC connected to the memory controller 212, the system includes
- 72 DQ single-ended signals to be received by the memory controller;
- 9 DQS differential signals to be received by the memory controller;
- 25 CA single-ended signals to be received by each memory device, 225 in total;
- 9 differential clocks to be received by the memory devices in total; and
- 72 DQ single-ended signals to be received by the memory devices in total.

Thus, the total number of single-ended signals to be received is 369. With prior art receivers, a receiver is required for each single-ended input signal (see FIG. 1B). Using the exemplary trellis receiver 100 disclosed herein, the number of receiver instances can be almost halved to 189, since the receiver 100 can receive two single-ended inputs.

The number of signals significantly increases if more complex systems are taken into account. Halving the number of receivers in a more complex system will have an even bigger impact. In the case of a fully buffered architecture, the memory controller interface is replicated on a Fully Buffered—Dual In Line Module (FB-DIMM). The FB-DIMM is usually used for systems with high capacity demand, where each memory channel can host up eight FB-DIMMs, and the memory subsystem can include two memory channels in the systems. Each FB-DIMM can in turn host up to 72 memory devices in four rank organization (in this case the number of the DQS signals doubles, as the timing is organized on a nibble basis, x4 organization). In such systems, the number of traditional receivers used for single-ended signals will be 31,104. Using the trellis receiver 100, the number of receivers needed for single-ended signals almost halves to 16,128.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit device, comprising:
   a first input terminal;
   a second input terminal;
   a first difference circuit coupled to the first and second input terminals to determine and output at an output terminal the difference between input signals received at the first and second input terminals;
   a first sum circuit coupled to the first and second input terminals to determine and output at an output terminal the sum of input signals received at the first and second input terminals;
   a second difference circuit coupled to the output terminals of the first difference circuit and the first sum circuit to determine and output the difference between signals output by the first difference circuit and the first sum circuit; and
   a second sum circuit coupled to the output terminals of the first difference circuit and the first sum circuit to determine and output the sum of signals output by the first difference circuit and the first sum circuit.

2. The integrated circuit device of claim 1, further comprising a memory device coupled to receive the outputs of the second difference and sum circuits.

3. The integrated circuit device of claim 2, wherein the memory device comprises a DRAM.

4. The integrated circuit device of claim 1, further comprising a memory controller coupled to receive the outputs of the second difference and sum circuits.

5. A memory system, comprising:
   a memory device;
   a receiver having
      first and second input terminals connected to receive first and second single-ended input signals or first and second differential signals,
      A first difference circuit coupled to the first and second input terminals to determine and output at an output terminal the difference between the input signals received at the first and second input terminals;
      a first sum circuit coupled to the first and second input terminals to determine and output at an output terminal the sum of the input signals received at the first and second input terminals;

a second difference circuit con led to the output terminals of the first difference circuit and the first sum circuit to determine and output the difference between signals output by the first difference circuit and the first sum circuit; and a second sum circuit coupled to the output terminals of the first difference circuit and the first sum circuit to determine and output the sum of signals output by the first difference circuit and the first sum circuit;

wherein the memory device is connected to receive outputs from the receiver.

6. The memory system of claim 5, further comprising a memory controller connected to the first and second input terminals.

7. The memory system of claim 5, further comprising a plurality of the receivers, the memory device connected to receive outputs from the receivers.

8. The memory system of claim 5, wherein the memory device comprises a DRAM.

9. An integrated circuit device, comprising:
   a first input terminal;
   a second input terminal;
   a first difference circuit coupled to the first and second input terminals to determine and output at an output terminal the difference between input signals received at the first and second input terminals;
   a second difference circuit coupled to the output terminal of the first difference circuit and to a constant voltage source to determine and output the difference between a signal output by the first difference circuit and the constant voltage source; and
   a sum circuit coupled to the output terminal of the first difference circuit and the constant voltage source to determine and output the sum of a signal output by the first difference circuit and the constant voltage source.

10. The integrated circuit device of claim 9, further comprising a memory device coupled to receive the outputs of the second difference and sum circuits.

11. The integrated circuit device of claim 10, wherein the memory device comprises a DRAM.

12. The integrated circuit device of claim 9, further comprising a memory controller coupled to receive the outputs of the second difference and sum circuits.

13. A method of converting signals received at a first logic level to a second logic level, comprising:
   receiving a first input signal;
   receiving a second input signal;
   outputting the difference of the first and second input signals at a first output;
   outputting the sum of the first and second input signals at a second output;
   outputting the sum of the first and second outputs; and
   outputting the difference of the second and first outputs.

14. The method of claim 13, wherein receiving the first and second input signals comprises receiving first and second single-ended input signals.

15. The method of claim 14, wherein the first and second single-ended input signals are the opposite polarity.

16. The method of claim 14, wherein the first and second single-ended input signals are the same polarity.

17. The method of claim 13, wherein the first input signal is the complement of the second input signal.

18. A method of converting differential signals received at a first logic level to a second logic level, comprising:
   receiving a first input signal;
   receiving a second input signal that is the complement of the first input signal;
   outputting the difference of the first and second input signals at an output;
   outputting the sum of the sum of the output and a constant; and
   outputting the difference of the constant and the output.

19. The method of claim 18, wherein the constant is 0.

* * * * *